United States Patent
Schuch et al.

(10) Patent No.: US 9,448,569 B2
(45) Date of Patent: Sep. 20, 2016

(54) SYSTEM FOR REDUCING THE THERMAL INERTIA OF AN ELECTRONIC DISPLAY

(71) Applicant: Manufacturing Resources International, Inc., Alpharetta, GA (US)

(72) Inventors: John Schuch, Buford, GA (US); Rick De Laet, Alpharetta, GA (US)

(73) Assignee: MANUFACTURING RESOURCES INTERNATIONAL, INC., Alpharetta, GA (US)

( * ) Notice: Subject to any disclaimer, the term of this patent is extended or adjusted under 35 U.S.C. 154(b) by 368 days.

(21) Appl. No.: 14/253,543

(22) Filed: Apr. 15, 2014

(65) Prior Publication Data

US 2014/0316606 A1 Oct. 23, 2014

Related U.S. Application Data

(60) Division of application No. 12/787,152, filed on May 25, 2010, now Pat. No. 8,700,226, and a continuation-in-part of application No. 12/711,600, filed on Feb. 24, 2010, now Pat. No. 8,569,910.

(60) Provisional application No. 61/308,139, filed on Feb. 25, 2010, provisional application No. 61/154,936, filed on Feb. 24, 2009.

(51) Int. Cl.
*G05D 23/19* (2006.01)
*G02F 1/1333* (2006.01)
(Continued)

(52) U.S. Cl.
CPC ..... *G05D 23/1917* (2013.01); *G02F 1/133382* (2013.01); *G02F 1/133385* (2013.01);
(Continued)

(58) Field of Classification Search
CPC ............... G05D 23/1917; G02F 1/133382; G02F 2001/13312; G02F 1/133385; G09G 2320/041; G09G 2360/144; H01L 51/529
See application file for complete search history.

(56) References Cited

U.S. PATENT DOCUMENTS 5,590,831 A * 1/1997 Manson ............... F24F 11/0009
236/51
6,003,015 A * 12/1999 Kang ................... G06Q 10/087
312/100

(Continued)

FOREIGN PATENT DOCUMENTS

JP 8115788 5/1996
JP 8193727 7/1996

(Continued)

*Primary Examiner* — Ramesh Patel
(74) *Attorney, Agent, or Firm* — Standley Law Group LLP

(57) ABSTRACT

A system for controlling the cooling fan within an electronic display based on the amount of ambient light present. An ambient light sensor is used to measure the amount of ambient light which is contacting the display. To anticipate a temperature rise and lower the thermal inertia of the display, the fan speed is increased when high ambient light levels are measured at the exterior of the display. The ambient light sensor data may be used to apply a temperature correction factor to a temperature sensor within the display. Alternatively, the ambient light sensor data may be used to apply a fan speed correction factor to a desired fan speed (calculated based on a temperature sensor within the display). Multiple systems or methods can be used simultaneously within the display to cool several components which may heat and cool at different rates relative to one another. The various systems can have similar or different logic depending on the amount of cooling needed and the manner in which the cooled-components produce/absorb heat.

14 Claims, 6 Drawing Sheets

(51) Int. Cl.
*H01L 51/52* (2006.01)
*G02F 1/133* (2006.01)

(52) U.S. Cl.
CPC .............. *G02F2001/13312* (2013.01); *G09G 2320/041* (2013.01); *G09G 2360/144* (2013.01); *H01L 51/529* (2013.01)

(56) References Cited

U.S. PATENT DOCUMENTS

| | | | |
|---|---|---|---|
| 6,798,341 B1 * | 9/2004 | Eckel | G01K 1/045 340/12.32 |
| 6,886,942 B2 * | 5/2005 | Okada | G03B 21/16 348/E9.027 |
| 7,015,470 B2 * | 3/2006 | Faytlin | B60R 1/00 250/330 |
| 7,330,002 B2 | 2/2008 | Joung | |
| 7,451,332 B2 * | 11/2008 | Culbert | G06F 1/206 713/300 |
| 7,474,294 B2 | 1/2009 | Leo et al. | |
| 7,982,706 B2 * | 7/2011 | Ichikawa | G02F 1/133611 345/102 |
| 8,087,787 B2 * | 1/2012 | Medin | G03B 21/16 353/52 |
| 8,142,027 B2 * | 3/2012 | Sakai | G03B 21/16 353/52 |
| 8,369,083 B2 * | 2/2013 | Dunn | G02F 1/133385 349/161 |
| 2003/0020884 A1 * | 1/2003 | Okada | G03B 21/16 353/57 |
| 2003/0230991 A1 | 12/2003 | Muthu et al. | |
| 2005/0012039 A1 * | 1/2005 | Faytlin | B60R 1/00 250/330 |
| 2005/0043907 A1 * | 2/2005 | Eckel | G01K 1/045 702/62 |
| 2005/0049729 A1 * | 3/2005 | Culbert | G06F 1/206 700/50 |
| 2005/0134526 A1 * | 6/2005 | Willem | G06F 3/1446 345/1.3 |
| 2005/0231457 A1 * | 10/2005 | Yamamoto | G09G 3/3413 345/102 |
| 2006/0022616 A1 * | 2/2006 | Furukawa | G02F 1/133603 315/309 |
| 2006/0130501 A1 * | 6/2006 | Singh | F25B 49/027 62/183 |
| 2007/0297163 A1 | 12/2007 | Kim et al. | |
| 2008/0055297 A1 * | 3/2008 | Park | G02F 1/13318 345/205 |
| 2008/0076342 A1 * | 3/2008 | Bryant | B60H 1/00735 454/75 |
| 2009/0009729 A1 * | 1/2009 | Sakai | G03B 21/16 353/57 |
| 2009/0033612 A1 * | 2/2009 | Roberts | G09G 3/3413 345/102 |
| 2009/0104989 A1 | 4/2009 | Williams et al. | |
| 2009/0306820 A1 * | 12/2009 | Simmons | G07F 9/026 700/244 |
| 2010/0060861 A1 * | 3/2010 | Medin | G03B 21/16 353/57 |
| 2010/0237697 A1 * | 9/2010 | Dunn | G06F 1/206 307/31 |
| 2011/0193872 A1 * | 8/2011 | Biernath | G09G 3/3406 345/589 |
| 2012/0284547 A1 * | 11/2012 | Culbert | G06F 1/20 713/322 |

FOREIGN PATENT DOCUMENTS

| | | |
|---|---|---|
| JP | 2000-122575 | 4/2000 |
| JP | 2007003638 | 1/2007 |
| WO | 2008-050402 | 5/2008 |

* cited by examiner

SYSTEM FOR REDUCING THE THERMAL INERTIA OF AN ELECTRONIC DISPLAY

CROSS-REFERENCE TO RELATED APPLICATIONS

This application is a divisional of U.S. application Ser. No. 12/787,152 filed on May 25, 2010, now U.S. Pat. No. 8,700,226 issued Apr. 15, 2014, which is a non-provisional application of U.S. Provisional Application No. 61/308,139 filed Feb. 25, 2010. U.S. application Ser. No. 12/787,152 is also a continuation-in-part of U.S. application Ser. No. 12/711,600 filed on Feb. 24, 2010, now U.S. Pat. No. 8,569,910 issued Oct. 29, 2013, which is a non-provisional application of U.S. Provisional Application No. 61/154,936 filed on Feb. 24, 2009. All aforementioned applications are hereby incorporated by reference in their entirety as if fully cited herein.

TECHNICAL FIELD

Exemplary embodiments generally relate to systems and methods for anticipating a temperature rise in an electronic display and reducing the thermal inertia of the display.

BACKGROUND OF THE ART

Improvements to electronic displays now allow them to be used in outdoor environments for informational, advertising, or entertainment purposes. While displays of the past were primarily designed for operation near room temperature, it is now desirable to have displays which are capable of withstanding large surrounding environmental temperature variations. For example, some displays are capable of operating at temperatures as low as −22 F and as high as 113 F or higher. When surrounding temperatures rise, the cooling of the internal display components can become even more difficult.

Additionally, modern displays have become extremely bright, with some backlights producing 1,000-2,000 nits or more. Sometimes, these illumination levels are necessary because the display is being used outdoors, or in other relatively bright areas where the display illumination must compete with other ambient light. In order to produce this level of brightness, illumination devices and electronic displays may produce a relatively large amount of heat.

Still further, in some situations radiative heat transfer from the sun through a front display surface can also become a source of heat. In some locations 800-1400 Watts/m$^2$ or more through such a front display surface is common. Furthermore, the market is demanding larger screen sizes for displays. With increased electronic display screen size and corresponding front display surfaces, more heat will be generated and more heat will be transmitted into the displays.

Exemplary modern displays have found some effective means for cooling the electronic displays which may be used in high ambient temperatures and/or in direct sunlight. Some modern displays may move some type of cooling gas with a fan assembly, either circulating within the display (closed loop) or passing through the display (ingested/exhausted or open loop). Typical designs would measure the temperature within the display and engage the cooling fans once the temperatures within the display reach a predetermined threshold. However, it has been found that electronic displays typically have a large amount of thermal inertia and large amounts of power are required to reverse the increase in temperature and cool the display. In other words, it is much harder and requires much more energy to cool the display once the temperature within the display has actually risen. Energy consumption has become a major concern with large electronic displays and it is desirable to limit and/or reduce their overall energy consumption as much as possible without effecting its performance.

Thus, it is now desirable to predict when and to what extent the display will rise in temperature, and preemptively engage the cooling fans so that the cooling gas can begin flowing and mitigate any potential rise in temperature.

SUMMARY OF THE EXEMPLARY EMBODIMENTS

Thus, it has been discovered that the exposure of the front display surface and/or housing to sunlight is a typical cause of many internal temperature rises within the display. This discovery has led to a potential relationship between a measurement of the amount of ambient light and a potential temperature rise within the display. The exemplary embodiments herein use the data from an ambient light sensor in order to apply a correction factor to the actual temperature data and/or the fan speeds in order to anticipate a rise in temperature and reduce its impact on the display.

The temperature sensors may be placed in one or more places within the display. Typically, the temperature sensors are placed in close proximity to one or more components that are known to increase in heat during operation (especially in high ambient temperatures and/or direct sunlight). In some embodiments, the temperature sensors are placed within or near the image assembly, on or in close proximity to one or more power modules, and/or near the backlight (if using a display type that requires a backlight, ex. liquid crystal displays). The fans are typically oriented so that they can force or draw cooling gas over these components (as well as others). The fans, temperature sensors, and ambient light sensor may be in electrical communication with a microprocessor (or other appropriate electronic control) so that a correction factor can be applied to the data from the temperature sensors so that the system 'thinks' it has already increased in temperature. Alternatively, the microprocessor could simply direct the fans to increase in speed depending on the data from the ambient light sensor.

The foregoing and other features and advantages will be apparent from the following more detailed description of the particular embodiments of the invention, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION

Figure 1A:
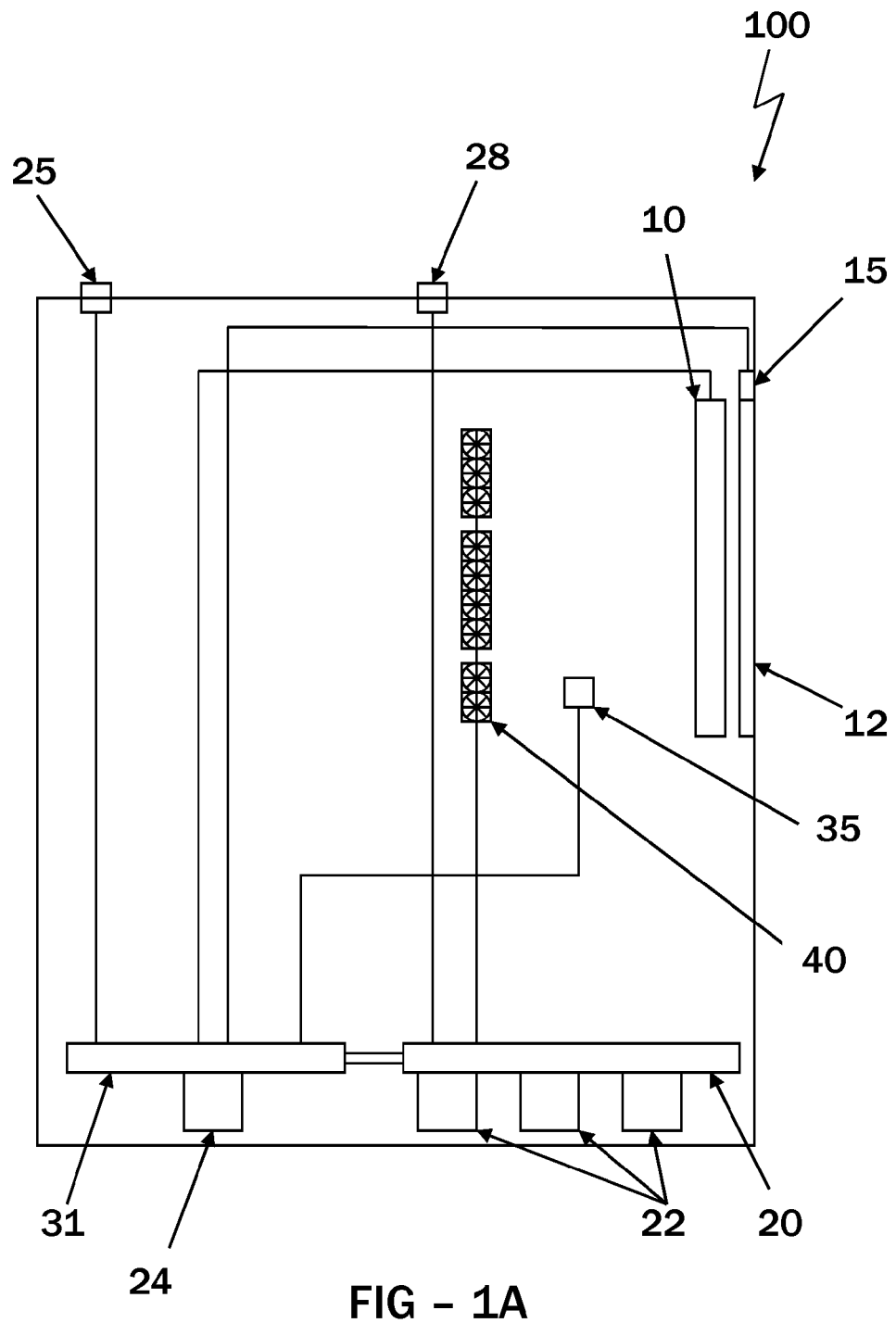
FIG. 1A shows an electrical block diagram for an exemplary display which contains a basic embodiment of the cooling system.

FIG. 1A shows an electrical block diagram for an exemplary display 100 which contains an embodiment of the cooling system. In this embodiment, an electronic image assembly 10 is placed behind a front display panel 12 (which may be used to protect the electronic image assembly 10 from damage). The electronic image assembly 10 shown here could be used with any type of electronic assembly for generating an image, including but not limited to: LCD, organic light-emitting diode (OLED), plasma, light emitting polymer (LEP), LED, or electroluminescent display.

An ambient light sensor 15 may be placed near the front portion of the display relatively close to the front display panel 12. The electronic image assembly 10 and the ambient light sensor 15 may be in electrical communication with a signal backplane 31. A display controller assembly 24 may be electrical communication with the signal backplane 31 and may contain several electronic components for controlling the various operations of the display.

A power backplane 20 may be in electrical communication with the signal backplane 31. One or more power modules 22 may be in electrical communication with the power backplane 20. In some embodiments, the signal backplane and power backplane may be combined into a single backplane to provide various electrical connections and communication to portions of the display. In other embodiments, there may be more backplanes in addition to the signal and power backplanes shown in this embodiment. In this embodiment, because there is electrical communication between the signal backplane 31 and the power backplane 20, components which are shown as being in electrical communication with either backplane could easily be shown or described as in electrical communication with the other backplane. The backplane designs which are shown are simply a suggestion and are not required.

A fan assembly 40 may be placed in electrical communication with the power backplane 20. The fan assembly 40 may be positioned so that it can force cooling gas over one or more components that are known to increase in heat during operation (especially in high ambient temperatures and/or direct sunlight). A temperature sensor 35 may be placed in electrical communication with the signal backplane 31. The temperature sensor 35 may also be positioned so that it can measure the temperature of one or more components that are known to increase in heat during operation (especially in high ambient temperatures and/or direct sunlight). A power input 28 may be connected to the power backplane 20 in order to supply power to the display.

The display controller assembly 24 may include several different components including, but not limited to a video receiving unit, decompressor, buffer, timing and control board, and display interface board (DIB). The display controller assembly 24 may also include a microprocessor or CPU for performing the logic to operate the exemplary embodiments herein. Thus, the temperature sensor 35, fan assembly 40, and ambient light sensor 15 may be in electrical communication with a microprocessor or CPU (located within the display controller assembly 24).

A video input 25 accepts the video data from a video source and may connect to the signal backplane 31 or may connect directly to the display controller assembly 24.

Figure 1B:
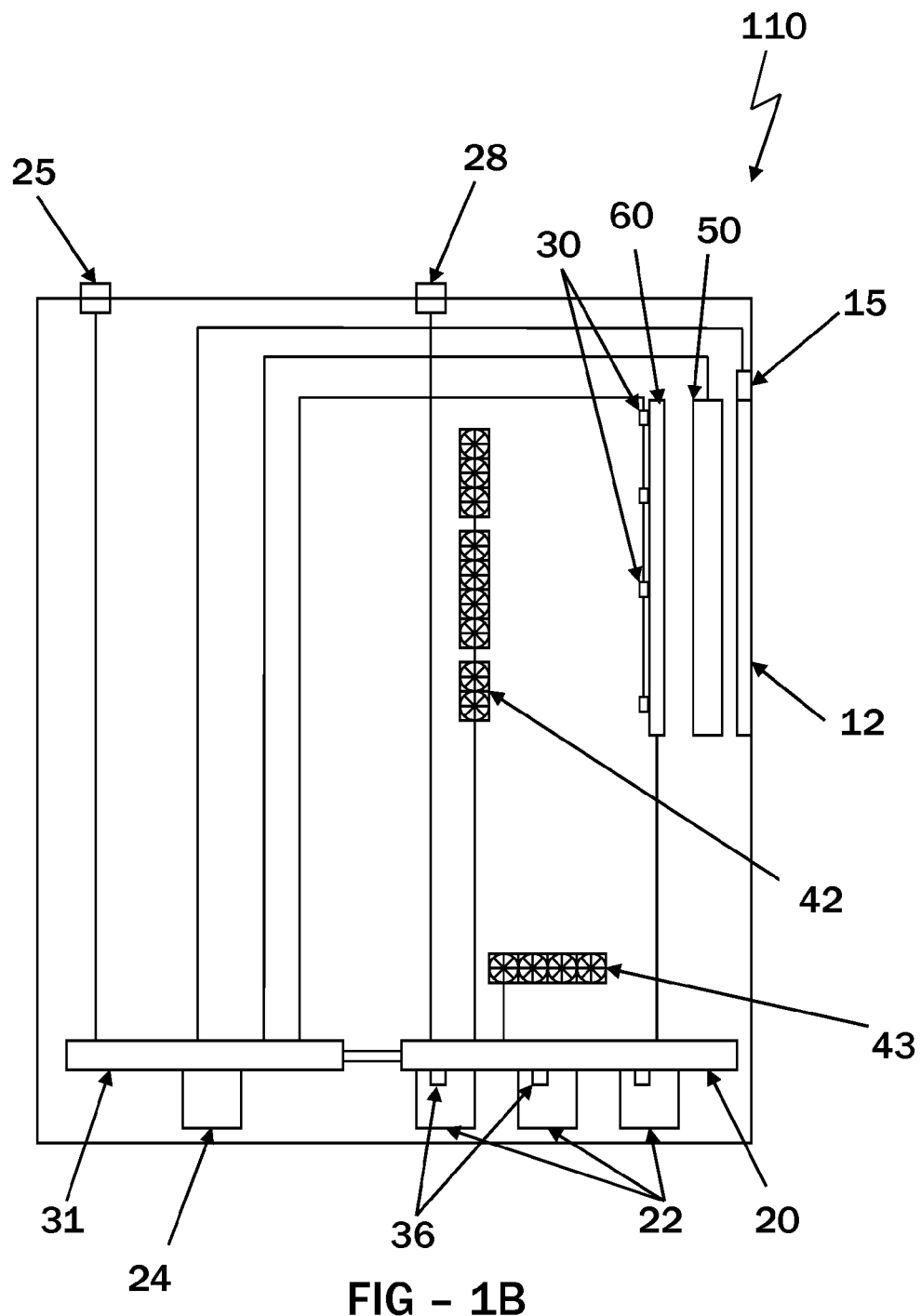
FIG. 1B shows an electrical block diagram for an exemplary display which contains an embodiment of the cooling system for cooling a LCD.

FIG. 1B shows an electrical block diagram for an exemplary display 110 which contains an embodiment of the cooling system for cooling a LCD. In this embodiment, a backlight 60 is placed behind a liquid crystal assembly 50. One or more temperature sensors 30 are placed on or near the backlight 60 and in electrical communication with the signal backplane 31. Further, one or more temperature sensors 36 are placed on or near the power modules 22. In this embodiment, a first fan assembly 42 is placed to force or draw cooling gas over the backlight 60. Also in this embodiment, a second fan assembly is placed to force or draw cooling gas over the power modules 22. Because the power modules 22 and the backlight 60 may increase in temperature as well as cool in different manners, it may be advantageous to use individual fan assemblies to cool each component, as shown here.

Figure 2:
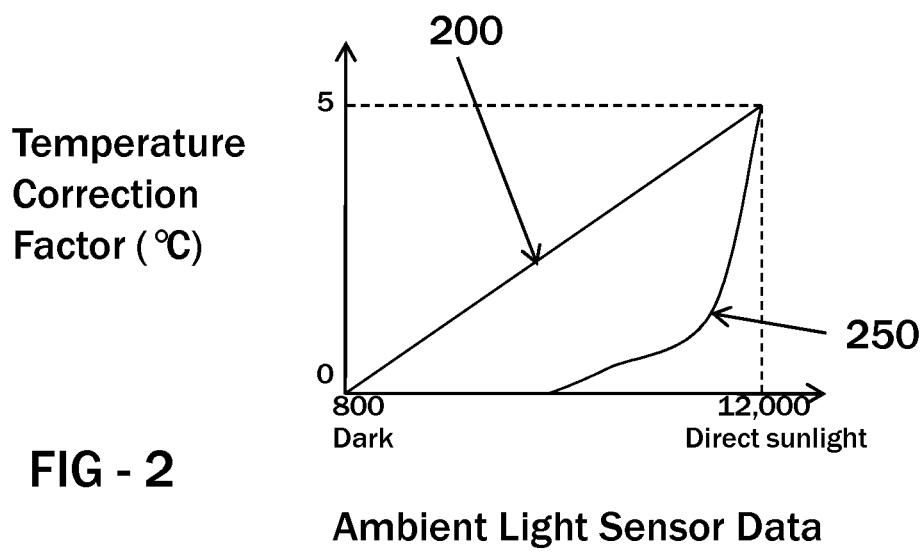
FIG. 2 shows a pair of example graphical relationships between the ambient light sensor data and the temperature correction factor.

FIG. 2 shows a pair of example graphical relationships between the ambient light sensor data and the temperature correction factor. Thus, in one embodiment of the system and method, the ambient light sensor data is used to calculate a temperature correction factor, which can be used to modify the actual temperature sensor data. As shown in FIG. 2, a linear relationship 200 may be used to calculate a temperature correction factor from a given value for the ambient light sensor data. For the linear relationship 200, the temperature correction factor increases linearly as the ambient light sensor data increases. Alternatively, a non-linear relationship 250 may be used to represent this data. The precise relationship may be selected depending on the particular electronic display and its desired operating conditions. The precise relationship can be determined through experimentation or simply by selecting a min/max and using linear interpolation. In general, as the amount of ambient light increases it becomes more likely that the internal components of the display will also increase in temperature. Accordingly, as the amount of ambient light increases a larger temperature correction factor is applied to the temperature sensor.

Figure 3:
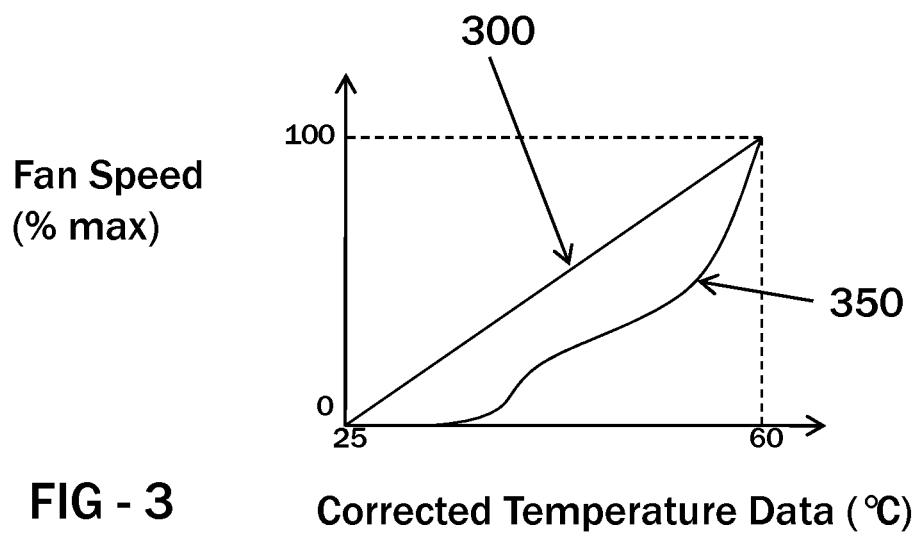
FIG. 3 shows a pair of example graphical relationships between the corrected temperature sensor data and the fan speed.

FIG. 3 shows a pair of example graphical relationships between the corrected temperature sensor data and the fan speed. The term 'corrected temperature data' is used here to represent the values which result from applying the temperature correction factors to the actual temperature data (i.e. modifying the actual temperature data by the correction factor. This could be done by any mathematic operation. In a basic embodiment, the temperature correction factors may simply be added to the actual temperature data). The fan speed can be adjusted in a number of ways depending on the corrected temperature data. Here, a linear relationship 300 is shown where the fan speed increases linearly as the corrected temperature increases. Further, a non-linear relationship 350 can also be used to represent the desired fan speeds for each corrected temperature. In general, the fan speeds increase as the corrected temperature data increases. The precise relationship can be determined through experimentation and/or theory or simply by selecting a min/max and using linear interpolation. It should be noted that the values for the x and y axis on both FIG. 2 and FIG. 3 were simply selected as examples and should not be used to imply that the operating conditions would only occur within these values or that an exemplary system could only handle data values within this range.

Figure 4:
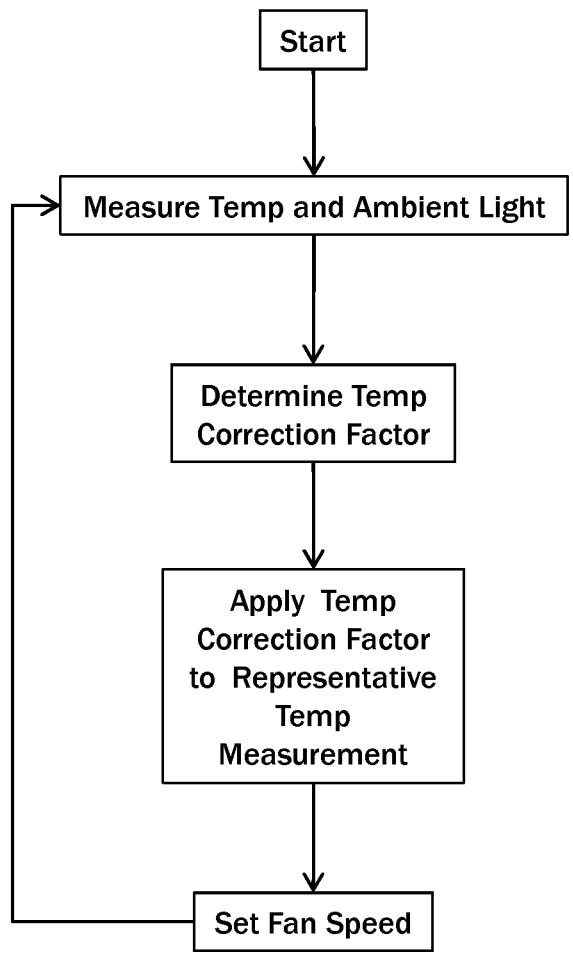
FIG. 4 shows a flow chart for the logic in operating an exemplary system or the steps in practicing an exemplary method.

FIG. 4 shows a flow chart for the logic in operating an exemplary system or the steps in practicing an exemplary method. Initially, the data from the temperature sensor(s) and ambient light sensor is collected. As discussed in reference to FIGS. 1A-1B above, there may be several temperature sensors located in several places throughout the display. When multiple temperature sensors are used, an average value may be calculated from the various sensors or a maximum value may be selected as the representative data for the system (herein 'representative temperature data'). Based on the data from the ambient light sensor, a temperature correction factor may be selected. The temperature correction factor may be selected by using one of the relationships shown and described in reference to FIG. 2, or anything similar. Next, the selected temperature correction factor may be applied to the representative temperature measurement. In general, the temperature correction factor is added or multiplied to the representative temperature measurement in order to create the corrected temperature data. As shown in FIG. 2, for some values of the ambient light sensor data, the temperature correction factor may be zero. Obviously, in this case there is no requirement that the temperature correction factor is applied to the representative temperature data since the correction factor is zero and this step may not be performed.

Once a corrected temperature value has been calculated, the fan speed may be selected based on this corrected value. The fan speed may be selected based on one of the relationships discussed in reference to FIG. 3 above. Thus, the temperature correction factor may cause the fan to run at a higher speed given the higher amount of ambient light that is contacting the display. The higher fan speeds can be used to increase the cooling ability of the display prior to letting the heat from the ambient light transfer into the interior of the display. By preemptively engaging the fans at a higher speed, the temperature increase due to high ambient light levels can be slowed or eliminated in an efficient manner, reducing the power consumption of the display and the wear/tear on fans and other electronics.

Figure 5:
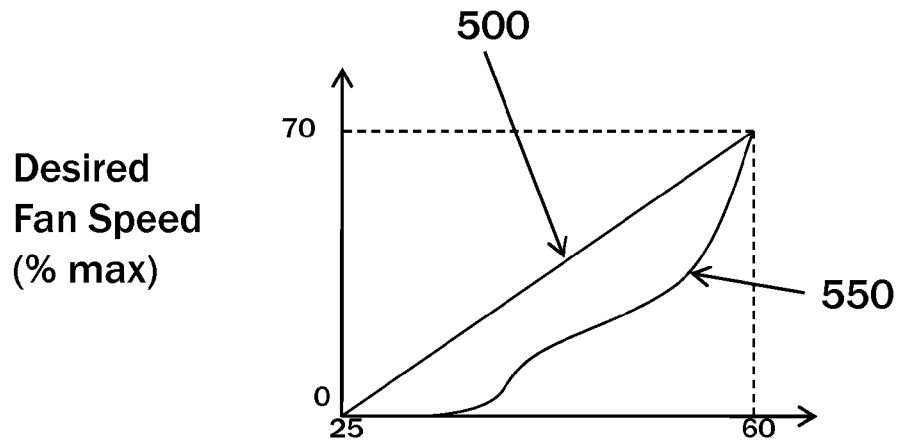
FIG. 5 shows a pair of example graphical relationships between the representative temperature sensor data and the fan speed.

FIG. 5 shows a pair of example graphical relationships between the representative temperature sensor data and the fan speed. Here, this graphical relationship is similar to that of FIG. 3 with the notable exception that the fan speed is dependent upon the actual representative temperature data and not the corrected temperature data. Again, the fan speed can be adjusted in a number of ways depending on the representative data from the temperature sensor(s). Here, a linear relationship 500 may be used where the desired fan speed increases linearly as the temperature increases. Further, a non-linear relationship 550 can also be used to represent the desired fan speeds for each temperature measurement. In general, the desired fan speeds increase as the temperatures increase. The precise relationship can be determined through experimentation or simply by selecting a min/max and using linear interpolation.

Figure 6:
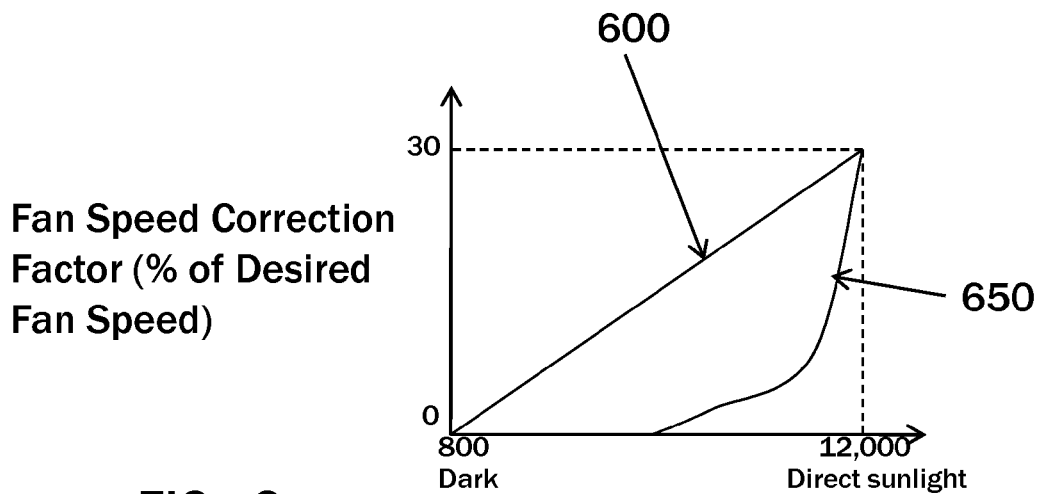
FIG. 6 shows a pair of example graphical relationships between the ambient light sensor data and a fan speed correction factor.

FIG. 6 shows a pair of example graphical relationships between the ambient light sensor data and a fan speed correction factor. Thus, in this embodiment a fan speed correction factor is used instead of a temperature correction factor. The fan speed correction factor may simply be a percentage of the desired fan speed (determined above in reference to FIG. 5). Thus, when the ambient light values are high, it may be desirable to increase the fan speed by 20%-30%. In one example, the fan speed correction factor increases linearly 600 as the ambient light sensor data increases. In another example, the fan speed correction factor increases non-linearly 650 as the ambient light sensor data increases.

It should again be noted that the values for the x and y axis on both FIG. 5 and FIG. 6 were simply selected as examples and should not be used to imply that the operating conditions would only occur within these values or that an exemplary system could only handle data values within this range.

Figure 7:
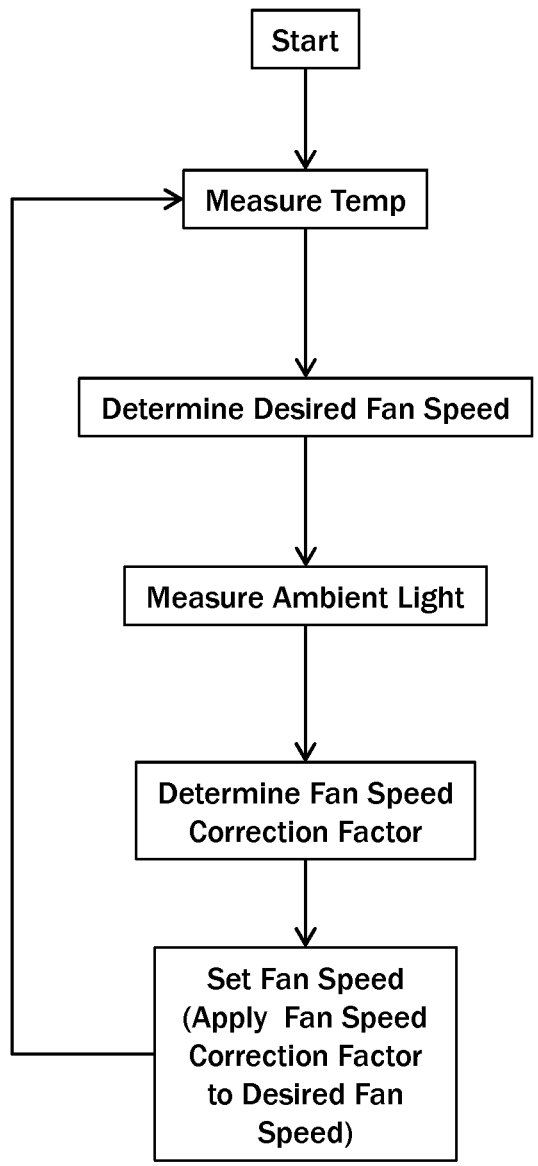
FIG. 7 shows a flow chart for the logic in operating another exemplary system or the steps in practicing another exemplary method.

FIG. 7 shows a flow chart for the logic in operating another exemplary system or the steps in practicing another exemplary method. Initially, the data from the temperature sensor(s) is collected. As discussed in reference to FIGS. 1A-1B and 4 above, there may be several temperature sensors located in several places throughout the display. When multiple temperature sensors are used, an average value may be calculated from the various sensors or a maximum value may be selected as the representative data for the system (herein 'representative temperature data'). Based on the representative temperature data, a desired fan speed may be selected. The desired fan speed may be selected by using one of the relationships shown and described in reference to FIG. 5. Next, the data from the ambient light sensor is gathered and used to determine a fan speed correction factor. The fan speed correction factor may be selected by using one of the relationships shown and described in reference to FIG. 6. Finally, the fan speed correction factor may be applied to the desired fan speed to account for the high levels of ambient light (provided that the fan speed correction factor is greater than 0%).

As shown in FIG. 1B, there may be multiple fan assemblies placed throughout the display. In these embodiments, there may be a control system for each fan assembly or even each fan. Further, each control system may have independent parameters. Thus, in reference to FIG. 1B, the logic which controls fan assembly 42 for cooling the backlight 60 may be different than the logic which controls fan assembly 43 for cooling the power modules 22.

Any number of gaseous matters may be used as the cooling gas described herein. The cooling gas may be circulating around the display, ingested into the display and exhausted, and/or circulated through the display. In some embodiments, the cooling gas may be ambient air which is ingested into the display. In some embodiments, the cooling gas may be ambient air which has been air conditioned prior to being ingested into the display.

Having shown and described preferred embodiments, those skilled in the art will realize that many variations and modifications may be made to affect the described embodiments and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

What is claimed is:

1. A system for anticipating the temperature rise of a component of an electronic display which typically experiences an increase in temperature when the display is exposed to high ambient light levels, the system comprising:
   an ambient light sensor producing a signal;
   a fan positioned so as to force cooling gas over the component; and
   a microprocessor which receives the ambient light sensor signal and uses the signal to control the speed of the fan.

2. The system of claim 1 further comprising:
a temperature sensor placed in proximity to the component and producing a signal;
wherein the microprocessor also receives the temperature sensor signal and uses the temperature signal and the ambient light sensor signal to control the speed of the fan.

3. The system of claim 2 wherein:
the temperature sensor is placed in proximity to a power module for the electronic display.

4. The system of claim 2 wherein:
the temperature sensor is placed in proximity to a display backlight.

5. A system for anticipating the temperature rise of a component of an electronic display which typically experiences an increase in temperature when the display is exposed to high ambient light levels, the system comprising:
an electronic image assembly;
a backplane in electrical communication with the electronic image assembly;
an ambient light sensor producing a signal;
a power module in electrical communication with the backplane;
a fan placed to force cooling gas over the power module;
a temperature sensor producing a signal and placed near the power module; and
a microprocessor which receives the ambient light sensor signal and temperature sensor signal and uses both signals to control the speed of the fan.

6. The system of claim 5 wherein:
the electronic image assembly is a liquid crystal display.

7. The system of claim 6 further comprising:
a backlight placed behind the liquid crystal display.

8. The system of claim 7 further comprising:
a second fan placed to force cooling gas over the backlight.

9. The system of claim 8 further comprising:
a second temperature sensor producing a signal and placed near the backlight.

10. The system of claim 9 wherein:
the microprocessor also receives the second temperature sensor signal and uses the ambient light sensor and second temperature sensor signal to control the speed of the second fan.

11. The system of claim 5 wherein:
the electronic image assembly is an OLED assembly.

12. A system for anticipating the temperature rise of a component of an electronic display which typically experiences an increase in temperature when the display is exposed to high ambient light levels, the system comprising:
an ambient light sensor producing a signal;
a temperature sensor producing a signal;
a fan positioned so as to force cooling gas over the component; and
a microprocessor which applies a temperature correction factor to the temperature sensor signal, where the temperature correction factor is dependent upon the ambient light sensor signal.

13. The system of claim 12 wherein:
the temperature sensor is placed in proximity to a power module for the electronic display.

14. The system of claim 12 wherein:
the temperature sensor is placed in proximity to a display backlight.

* * * * *

UNITED STATES PATENT AND TRADEMARK OFFICE
CERTIFICATE OF CORRECTION

PATENT NO. : 9,448,569 B2  
APPLICATION NO. : 14/253543  
DATED : September 20, 2016  
INVENTOR(S) : John Schuch et al.

Page 1 of 1

It is certified that error appears in the above-identified patent and that said Letters Patent is hereby corrected as shown below:

On the Title Page

Item (63) Related U.S. Application Data, please delete "Division of application No. 12/787,152, filed on May 25, 2010, now Patent No. 8,700,226, and a continuation-in-part of application No. 12/711,600, filed on Feb. 24, 2010, now Patent No. 8,569,910." and insert -- "Division of application No. 12/787,152, filed on May 25, 2010, now U.S. Patent 8,700,226, which is a non-provisional application of application No. 61/308,139, filed on Feb. 25, 2010. U.S. Application No. 12/787,152 is also a continuation-in-part of application No. 12/711,600, filed on Feb. 24, 2010, now U.S. Patent 8,569,910, which is a non-provisional application of application No. 61/154,936 filed on Feb. 24, 2009. --

Signed and Sealed this
Fourth Day of April, 2017

Michelle K. Lee
*Director of the United States Patent and Trademark Office*